United States Patent
Kim et al.

(10) Patent No.: US 8,361,860 B2
(45) Date of Patent: Jan. 29, 2013

(54) METHOD OF MANUFACTURING SEMICONDUCTOR DEVICE

(75) Inventors: Jin-bum Kim, Seoul (KR); Wook-je Kim, Gwacheon-si (KR); Kwan-heum Lee, Suwon-si (KR); Yu-gyun Shin, Seongnam-si (KR); Sun-ghil Lee, Yongin-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 325 days.

(21) Appl. No.: 12/656,130

(22) Filed: Jan. 19, 2010

(65) Prior Publication Data

US 2010/0330758 A1    Dec. 30, 2010

(30) Foreign Application Priority Data

Jun. 26, 2009    (KR) .................. 10-2009-0057719

(51) Int. Cl.
*H01L 21/8242*    (2006.01)

(52) U.S. Cl. .................. 438/239; 257/E21.159; 257/296

(58) Field of Classification Search .................. 438/239, 438/655, 243, 244, 250, 253, 386, 387, 393, 438/396; 257/E21.159, E21.646, 296–314
See application file for complete search history.

(56) References Cited

U.S. PATENT DOCUMENTS

| 2006/0046378 A1* | 3/2006 | Choi et al. ........... 438/238 |
| 2008/0081430 A1* | 4/2008 | Park et al. ........... 438/393 |
| 2008/0283832 A1* | 11/2008 | Goldbach et al. ....... 257/51 |

FOREIGN PATENT DOCUMENTS

| KR | 10-2000-0004355 | 1/2000 |
| KR | 10-0284141 | 12/2000 |
| KR | 10-2005-0002985 | 1/2005 |

* cited by examiner

*Primary Examiner* — Tony Tran
(74) *Attorney, Agent, or Firm* — Harness, Dickey & Pierce, P.L.C.

(57) ABSTRACT

A method of manufacturing a semiconductor device may include forming a first interlayer insulation layer on a substrate including at least one gate structure formed thereon, the substrate having a plurality of source/drain regions formed on both sides of the at least one gate structure, forming at least one buried contact plug on at least one of the plurality of source/drain regions and in the first interlayer insulation layer, forming a second interlayer insulation layer on the first interlayer insulation layer and the at least one buried contact plug, exposing the at least one buried contact plug in the second interlayer insulation layer by forming at least one contact hole, implanting ions in the at least one contact hole in order to create an amorphous upper portion of the at least one buried contact plug, depositing a lower electrode layer on the second interlayer insulation layer and the at least one contact hole, and forming a metal silicide layer in the amorphous upper portion of the at least one buried contact plug.

15 Claims, 6 Drawing Sheets

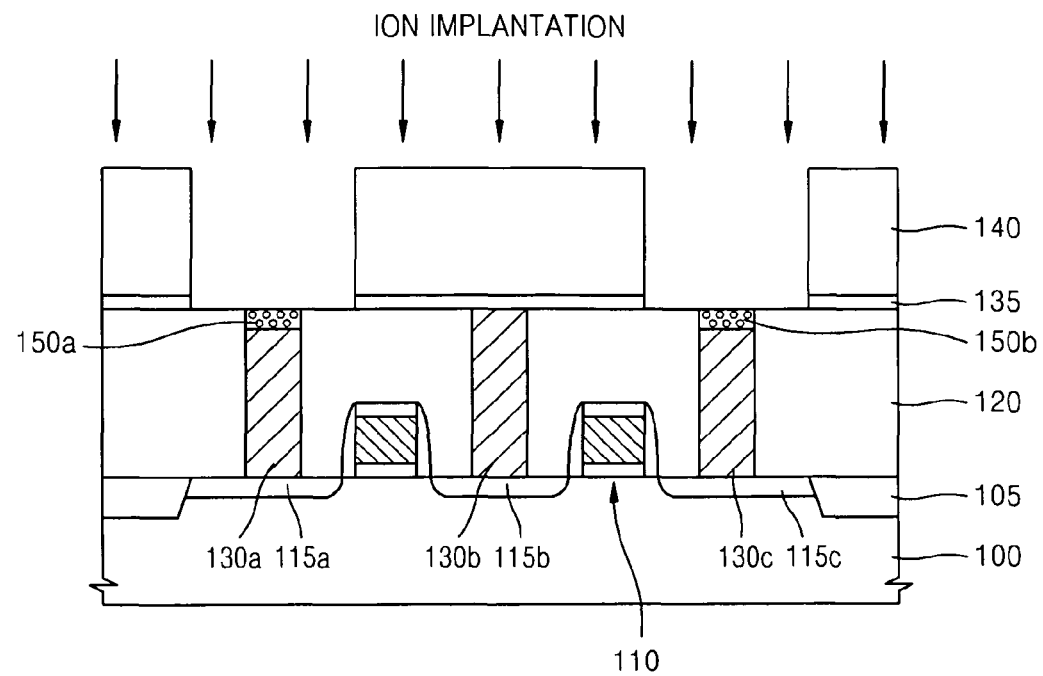
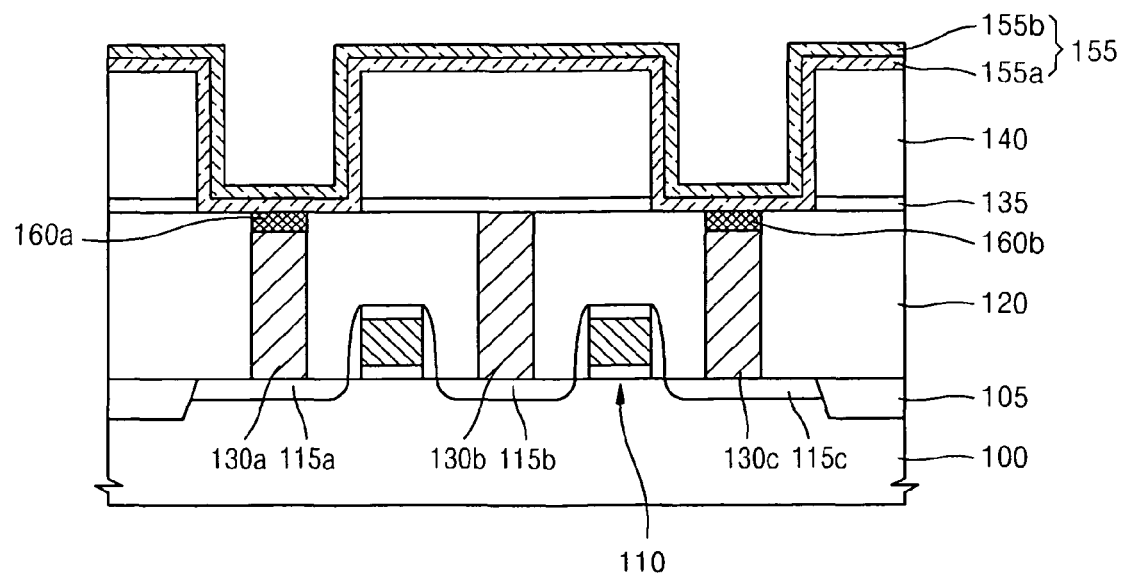

METHOD OF MANUFACTURING SEMICONDUCTOR DEVICE

CROSS-REFERENCE TO RELATED APPLICATIONS

This application claims priority under U.S.C. §119 to Korean Patent Application No. 10-2009-0057719, filed on Jun. 26, 2009, in the Korean Intellectual Property Office (KIPO), the entire contents of which are incorporated herein by reference.

BACKGROUND

1. Field

Example embodiments of the inventive concepts relate to a method of manufacturing a semiconductor device, and more particularly, to a method of manufacturing a semiconductor device which reduces resistance between a lower electrode of a storage node and a buried contact plug of a semiconductor device.

2. Description of the Related Art

As a semiconductor device, e.g., a dynamic random access memory (DRAM), is highly integrated, a pattern width decreases and design rule decreases. The decrease in the design rule may make it difficult to stably secure the characteristic of a capacitor or a transistor. Thus, a cylinder type capacitor may be used for a device, e.g., a DRAM, to increase the electrostatic capacity of a capacitor.

SUMMARY

According to example embodiments of the inventive concepts, a method of manufacturing a semiconductor device may include forming a first interlayer insulation layer on a substrate including at least one gate structure formed thereon, the substrate having a plurality of source/drain regions formed on both sides of the at least one gate structure, forming at least one buried contact plug on at least one of the plurality of source/drain regions and in the first interlayer insulation layer, forming a second interlayer insulation layer on the first interlayer insulation layer and the at least one buried contact plug, exposing the at least one buried contact plug in the second interlayer insulation layer by forming at least one contact hole, implanting ions in the at least one contact hole in order to create an amorphous upper portion of the at least one buried contact plug, depositing a lower electrode layer on the second interlayer insulation layer and the at least one contact hole and forming a metal silicide layer in the amorphous upper portion of the at least one buried contact plug.

The method may further include depositing a sacrificial layer on the lower electrode layer, forming at least one lower electrode from the lower electrode layer by patterning the second interlayer insulation layer and the sacrificial layer and performing a heat treatment on the substrate where the at least one lower electrode is formed. Performing the heat treatment may further include performing a thermal nitridation process on the substrate where the at least one lower electrode is formed to improve crystallization of the at least one lower electrode.

The thermal nitridation process may be performed using an $NH_3$ gas by at least one of a rapid thermal nitridation process (RTP), a spike RTP (s-RTP), and a flash RTP. The lower electrode layer may have a deposition structure of metal and metal nitride, and the at least one lower electrode may have a metal nitride structure by the thermal nitridation process. The amorphous area of the at least one buried contact plug may be an amorphous silicon area, and the thickness of the amorphous silicon area may be within a range of about 30 Å to about 1,000 Å.

Forming the metal silicide layer may include performing a heat treatment on the substrate where the lower electrode layer is deposited at a temperature within a range of about 500° C. to about 900° C. and forming the metal silicide layer by a silicide reaction between the amorphous silicon area and the lower electrode layer. The method may further include forming an etch stop layer on the first interlayer insulation layer and the at least one buried contact plug and forming the second interlayer insulation layer on the etch stop layer.

The ions may be formed of at least one of Group V elements and inert elements, the Group V elements may include As, P, and $N_2$, and the inert elements include Ar and F. Implanting ions in the at least one contact hole may further include performing an ion implantation process with a dosage of about $1E^{13}$ ions/cm$^2$ to $5E^{16}$ ions/cm$^2$ and an energy of about 1 keV to about 50 keV. The metal of the lower electrode layer may be formed to have a thickness within a range of about 10 Å to about 300 Å and the thickness of the metal nitride is within a range of about 20 Å to about 500 Å.

Forming the at least one gate structure may include sequentially depositing a gate insulating layer, a gate electrode layer and a capping layer on an active region of the substrate; patterning the gate insulating layer, the gate electrode layer and the capping layer; and forming spacers on sidewalls of the gate insulating layer, the gate electrode layer and the capping layer. The method may further include forming the plurality of source/drain regions on both sides of the at least one gate structure in the active region of the substrate by performing a highly concentrated ion implantation process in the active region using the spacer as a mask.

The first interlayer insulation layer and second interlayer insulation layers may be formed by using at least one of chemical vapor deposition (CVD), plasma-enhanced CVD (PECVD), low-pressure CVD (LPCVD), atomic layer deposition (ALD), and spin on glass (SOG) and the thickness of the second interlayer insulation layer is about 8 μm or more. The at least one contact hole may be formed to have a diameter within a range of about 80 nm to about 90 nm. The thickness of the amorphous upper portion of the at least one buried contact plug may be within a range of about 30 Å to 1,000 Å. The lower electrode layer may be formed by using at least one of CVD, ALD, PECVD, plasma assisted ALD (PAALD), and cyclic CVD, and wherein the metal layer of the lower electrode layer is a Ti layer having a thickness within a range of about 10 Å to about 300 Å and the metal nitride layer of the lower electrode layer is a TiN layer having a thickness within a range of about 20 Å to about 500 Å.

BRIEF DESCRIPTION OF THE DRAWINGS

Example embodiments of the inventive concepts will be more clearly understood from the following detailed description taken in conjunction with the accompanying drawings in which:

FIGS. 1-10 are cross-sectional views illustrating a method of manufacturing a semiconductor device according to example embodiments of the inventive concepts.

DETAILED DESCRIPTION OF EXAMPLE EMBODIMENTS

Figure 1:
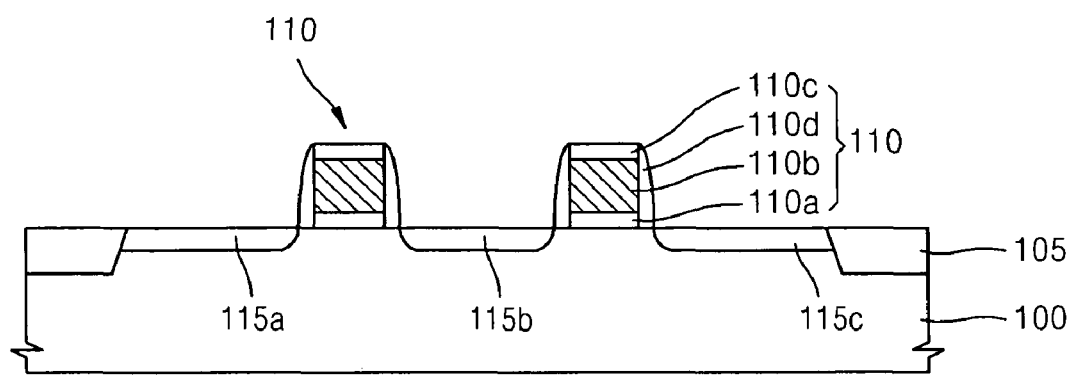

Reference will now be made in detail to example embodiments, examples of which are illustrated in the accompanying drawings. However, example embodiments of the inventive concepts are not limited to the example embodiments illustrated hereinafter, and the embodiments herein are rather introduced to provide easy and complete understanding of the scope and spirit of example embodiments. In the drawings, the thicknesses of layers and regions are exaggerated for clarity.

It will be understood that when an element, such as a layer, a region, or a substrate, is referred to as being "on," "connected to" or "coupled to" another element, it may be directly on, connected or coupled to the other element or intervening elements may be present. In contrast, when an element is referred to as being "directly on," "directly connected to" or "directly coupled to" another element or layer, there are no intervening elements or layers present. Like reference numerals refer to like elements throughout.

It will be understood that, although the terms first, second, third, etc., may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of example embodiments.

Spatially relative terms, such as "above," "upper," "beneath," "below," "lower," and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "above" may encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises" and/or "comprising" when used in this specification, specify the presence of stated features, integers, steps, operations, elements, and/or components, but do not preclude the presence or addition of one or more other features, integers, steps, operations, elements, components, and/or groups thereof.

FIGS. 1-10 are cross-sectional views illustrating a method of manufacturing a semiconductor device according to example embodiments of the inventive concepts. Referring to FIGS. 1-10, a method of manufacturing a semiconductor device according to example embodiments will be described with an example of a method of manufacturing a DRAM including a capacitor and a transistor. However, the method should not be interpreted to limit the technical scope of example embodiments of the inventive concepts and may be applied to other semiconductor devices having a lower electrode or a storage node, e.g., a capacitor.

Referring to FIG. 1, a substrate 100 may include an active region defined by an isolation layer 105. The substrate 100 may be a semiconductor substrate and include, for example, any one of silicon, silicon-on-insulator, silicon-on-sapphire, germanium, silicon-germanium, and gallium-arsenide. The isolation layer 105 may be implemented by a shallow trench isolation (STI) process. Although not illustrated in FIG. 1, a P-well or an N-well may be included in the active region.

At least one gate structure 110 may be vertically formed in the active region. Although two gate structures are illustrated in FIG. 1 for convenience of illustration, more gate structures may be formed in the active region. The gate structure 110 may include a gate insulation layer 110a, a gate electrode layer 110b, a capping layer 110c, and a spacer 110d.

In detail, the gate structure 110 may be formed by sequentially depositing the gate insulation layer 110a, the gate electrode layer 110b, and the capping layer 110c on and above the active region and patterning the deposited layers. The gate insulation layer 110a may be a silicon oxide layer, but not limited thereto. For example, the gate insulation layer 110a may include a high dielectric thin layer, e.g., a silicon nitride layer SiNx, a tantalum oxide layer TaOx, a hafnium oxide layer HfOx, an aluminium oxide layer AlOx, and a zinc oxide layer ZnOx, each having a permittivity higher than that of a silicon oxide layer. The gate electrode layer 110b may be a polysilicon layer doped at a high concentration, a metal layer, e.g., tungsten (W), nickel (Ni), molybdenum (Mo), and/or cobalt (Co), a metal silicide layer, or a combination thereof. The capping layer 110c may be a silicon nitride layer or a silicon oxide layer. The spacer 110d may be formed on side walls of the gate insulation layer 110a, the gate electrode layer 110b, and the capping layer 110c and may be an oxide layer, a silicon oxide layer, a silicon nitride layer, a silicon oxide-nitride layer, or a combination thereof.

First through third source/drain regions 115a, 115b, and 115c may be formed on both sides of the gate structure 110 in the active region. In detail, the first through third source/drain regions 115a, 115b, and 115c may be formed by performing a highly concentrated ion implantation process in the active region using the spacer 110d as a mask.

Figure 2:
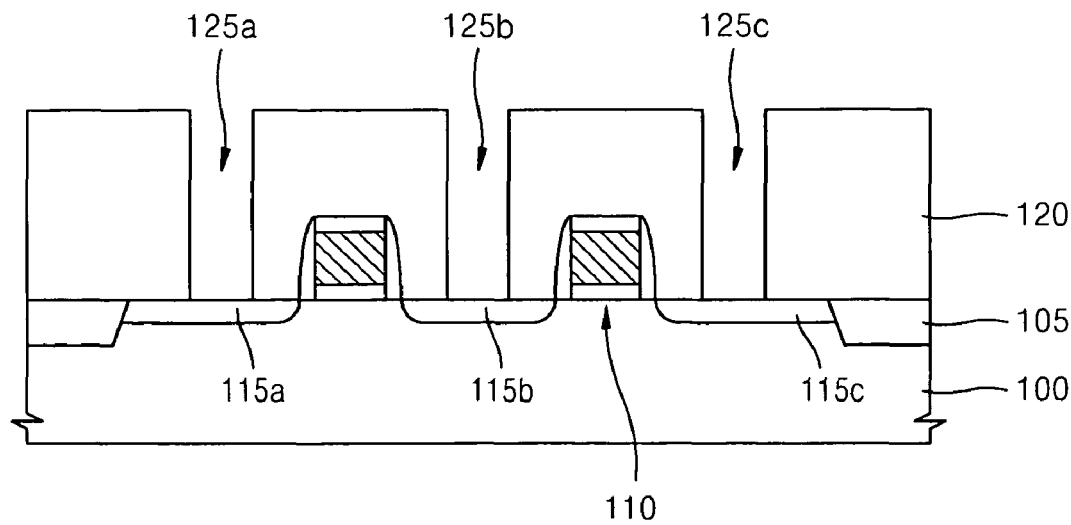

Referring to FIG. 2, a first interlayer insulation layer 120 may be formed on the substrate 100 on which the gate structure 110 is formed. The gate structure 110 may be buried in the first interlayer insulation layer 120. The first interlayer insulation layer 120 may be formed by using at least one of chemical vapor deposition (CVD), plasma-enhanced CVD (PECVD), low-pressure CVD (LPCVD), atomic layer deposition (ALD), and spin on glass (SOG). Also, the first interlayer insulation layer 120 may be at least one of hydrogen silsesquioxane (HSQ), boron phosphorus silicate glass (BPSG), a high density plasma (HDP) oxide layer, plasma enhanced tetraethyl orthosilicate (PETEOS), undoped silicate glass (USG), phosphorus silicate glass (PSG), PE-SiH$_4$, and Al$_2$O$_3$, but not limited thereto.

A plurality of first contact holes 125a, 125b, and 125c may be formed in the first interlayer insulation layer 120 in parts of the first through third source/drain regions 115a, 115b, and 115c. In detail, the first contact holes 125a, 125b, and 125c may expose parts of the first through third source/drain regions 115a, 115b, and 115c. A mask layer (not shown) exposing areas in which the first contact holes 125a, 125b, and 125c are formed may be formed on the first interlayer insulation layer 120 by a photolithography method. The first contact holes 125a, 125b, and 125c may be formed by patterning the first interlayer insulation layer 120 by an etching processing.

Figure 3:
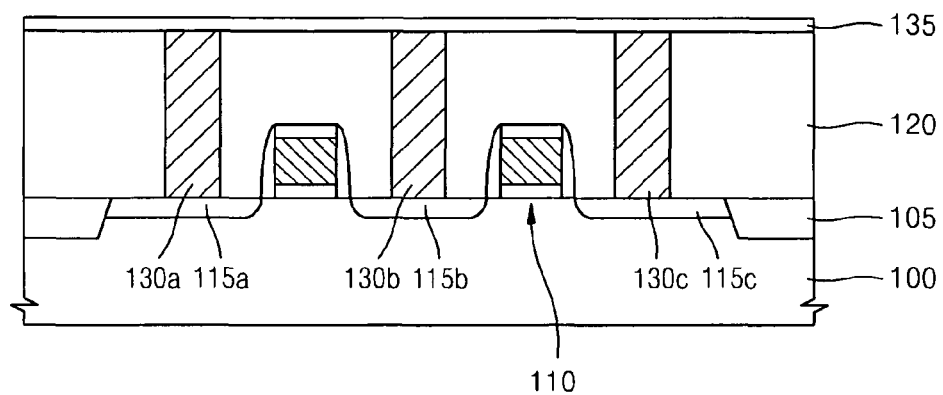

Referring to FIG. 3, polysilicon may be deposited on the first interlayer insulation layer 120 to bury the first contact holes 125a, 125b, and 125c so that first through third buried contact plugs 130a, 130b, and 130c may be respectively formed in the first contact holes 125a, 125b, and 125c. The upper portions of the first interlayer insulation layer 120 and the first through third buried contact plugs 130a, 130b, and 130c may be planarized. An etch stop layer 135 may be formed on the planarized upper portions of the first interlayer insulation layer 120 and the first through third buried contact plugs 130a, 130b, and 130c. The etch stop layer 130 may be a silicon nitride layer, but not limited thereto. The upper portions of the first interlayer insulation layer 120 and the first through third buried contact plugs 130a, 130b, and 130c may be planarized by using chemical mechanical polishing (CMP).

Figure 4:
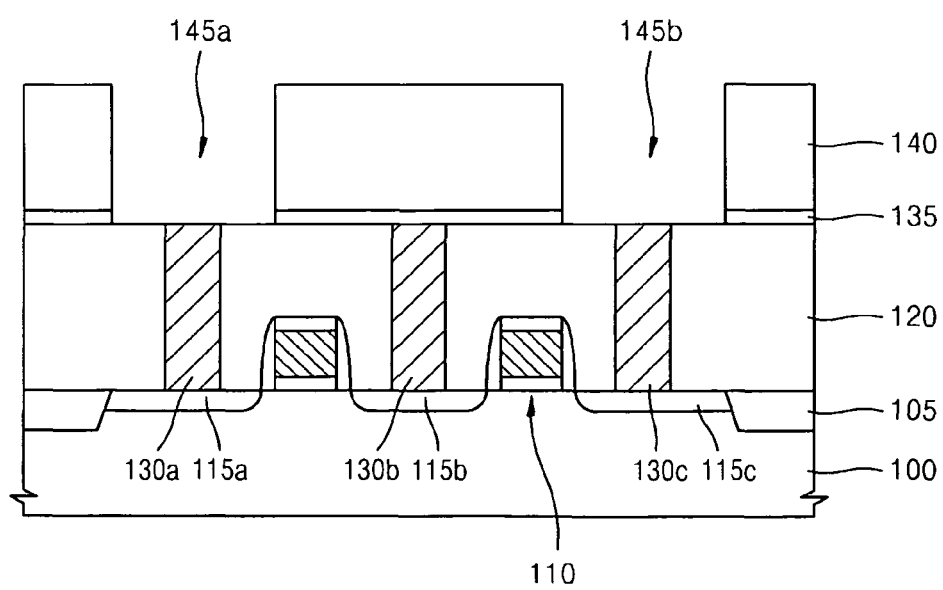

Referring to FIG. 4, a second interlayer insulation layer 140 may be formed on the etch stop layer 135. The second interlayer insulation layer 140 may be formed by using at least one of PECVD, LPCVD, ALD, and SOG. Also, the second interlayer insulation layer 140 may be at least one of a silicon oxide layer, HSQ, BPSG, a HDP oxide layer, PETEOS, USG, PSG, PE-SiH$_4$, and Al$_2$O$_3$, but not limited thereto. For example, the thickness of the second interlayer insulation layer 140 may be 8 μm or more.

A plurality of second contact holes 145a and 145b may be formed in the second interlayer insulation layer 140 above the first and third buried contact plugs 130a and 130c. In detail, the second contact holes 145a and 145b may be formed to expose the upper portions of the first and third buried contact plugs 130a and 130c. A mask layer (not shown) exposing areas in which the second contact holes 145a and 145b are formed may be formed on the second interlayer insulation layer 140 by a photolithography process. The second interlayer insulation layer 140 and the etch stop layer 135 may be patterned by an etching process, thus forming the second contact holes 145a and 145b. For example, the diameter of each of the second contact holes 145a and 145b may be within a range of about 80 nm to about 90 nm. The second contact holes 145a and 145b may form a capacitor.

Recently, as the design rule of a DRAM device decreases, the diameter of a contact hole to form a capacitor decreases as well. In detail, a metal-insulator-metal (MIM) capacitor may be formed by sequentially depositing a lower electrode, a dielectric layer, and an upper electrode in a contact hole for forming the MIM capacitor. When the diameter of the contact hole decreases, the lower electrode may not be thickly deposited. Accordingly, a metal silicide layer that is formed due to a silicide reaction occurring between the lower electrode and the polysilicon included in the buried contact plug under the lower electrode is not uniform so that, as a coagulation phenomenon of the metal silicide layer becomes severe, and resistance may increase. Thus, to improve the resistance matter between the lower electrode of a capacitor and the buried contact plug under the lower electrode, the quality of the metal silicide layer may be formed to be uniform.

Referring to FIG. 5, a predetermined or given ion may be implanted in the second contact holes 145a and 145b by performing an ion implantation process. The predetermined or given ion may be at least one of Group V elements, e.g., As, P, and N$_2$, and inert elements, e.g., Ar and F, but not limited thereto. Also, the ion implantation process may be performed within ranges of a predetermined or given dosage and energy. The range of a predetermined or given dosage may be about $1E^{13}$ ions/cm$^2$ to about $5E^{16}$ ions/cm$^2$ and the range of a predetermined or given energy may be about 1 keV to about 50 keV.

The upper portions of the first and third buried contact plugs 130a and 130c exposed by the second contact holes 145a and 145b become amorphous by the ion implantation process so that amorphous areas 150a and 150b may be formed. In detail, the first and third buried contact plugs 130a and 130c may include polysilicon. As the predetermined or given ion is implanted in the upper portions of the first and third buried contact plugs 130a and 130c, parts of the polysilicon included in the first and third buried contact plug 130a and 130c may become amorphous, thereby producing amorphous silicon. The thickness of each of the amorphous areas 150a and 150b may be within a range of about 30 Å to about 1,000 Å.

A silicide reaction actively takes place between the amorphous areas 150a and 150b and the lower electrode that is to be deposited in each of the amorphous areas 150a and 150b. Accordingly, the metal silicide layer may be formed to be further uniform. Although the size of an area in which the amorphous areas 150a and 150b contact the lower electrodes decrease as the diameter of the contact hole for forming a capacitor decreases according to the decrease in the design rule, because a silicide reaction actively takes place between the amorphous silicon included in the amorphous areas 150a and 150b and the lower electrode, the metal silicide layer may be formed to be further uniform.

The term "crystal" denotes regular arrangement of molecules. The term "mono-crystalline" signifies that the regular arrangement of molecules is uniformly distributed over a solid. The term "polycrystalline" signifies that a solid is partially crystallized but the solid is not uniformly crystallized as a whole. The term "amorphous" signifies that molecules are arbitrarily arranged without regularity. Because the first and third buried contact plugs 130a and 130c include polysilicon that is polycrystalline, a disorder area referred to as a grain boundary exists between grains of polysilicon. In the operation to be described later, a silicide reaction takes place between the polysilicon included in the first and third buried contact plugs 130a and 130c and a metal layer to be deposited thereon, thereby forming a metal silicide layer. Because the silicide reaction may take place more actively at the grain boundary in the polysilicon included in the first and third buried contact plugs 130a and 130c, the metal silicide layer may be irregularly formed.

However, in example embodiments, the amorphous areas 150a and 150b may be formed by making the upper portions of the first and third buried contact plugs 130a and 130c amorphous through an ion implantation process. Because the silicon exists as amorphous silicon in the amorphous areas 150a and 150b, the amorphous areas 150a and 150b do not have the grain boundary. Thus, a silicide reaction may actively take place between the amorphous areas 150a and 150b and the metal layer to be deposited thereon so that the metal silicide layer may be more uniform.

Referring to FIG. 6, a lower electrode layer 155 may be formed on the second interlayer insulation layer 140 and the second contact holes 145a and 145b. The lower electrode layer 155 may have a deposition structure of a metal layer 155a and a metal nitride layer 155b. In the following description, the metal layer 155a may be a Ti layer 155a and the metal nitride layer 155b may be a TiN layer 155b. However, the structure of the lower electrode layer 155 is not limited thereto and the lower electrode layer 155 may be formed of at least one of, for example, cobalt (Co), molybdenum (Mo), tantalum (Ta), zirconium (Zr), tungsten (W), and nickel (Ni). The lower electrode layer 155 may be formed by using at least one of CVD, ALD, PECVD, plasma assisted ALD (PAALD), and cyclic CVD. The thickness of the Ti layer 155a may be within a range of about 10 Å to about 300 Å and the thickness of the TiN layer 155b may be within a range of about 20 Å to about 500 Å.

The substrate 100 on which the lower electrode layer 155 is formed may be heat treated at a predetermined or given temperature. By performing the above heat treatment, a silicide reaction takes place between the amorphous silicon of the amorphous areas 150a and 150b in the first and third buried contact plugs 130a and 130c and the Ti layer 155a, metal silicide layers 160a and 160b are formed. The predetermined or given temperature may be within a range of about 500° C. to about 900° C.

As described above, as the diameter of each of the second contact holes 145a and 145b decreases, the deposition thickness of the lower electrode layer 155, that is, the Ti layer 155a and the TiN layer 155b, decreases. However, as the upper portions of the first and third buried contact plugs 130a and 130b are formed as the amorphous areas 150a and 150b, a silicide reaction may uniformly take place between the amorphous silicon included in the amorphous areas 150a and 150b and the Ti layer 155a being relatively thin. Accordingly, the metal silicide layers 160a and 160b that are formed by the silicide reaction may be formed uniformly. Also, as the metal silicide layers 160a and 160b are uniformly formed, an aggregation phenomenon may be greatly reduced in the metal silicide layers 160a and 160b in the subsequent process, that is, a thermal nitridation process performed at a higher temperature.

Figure 7:
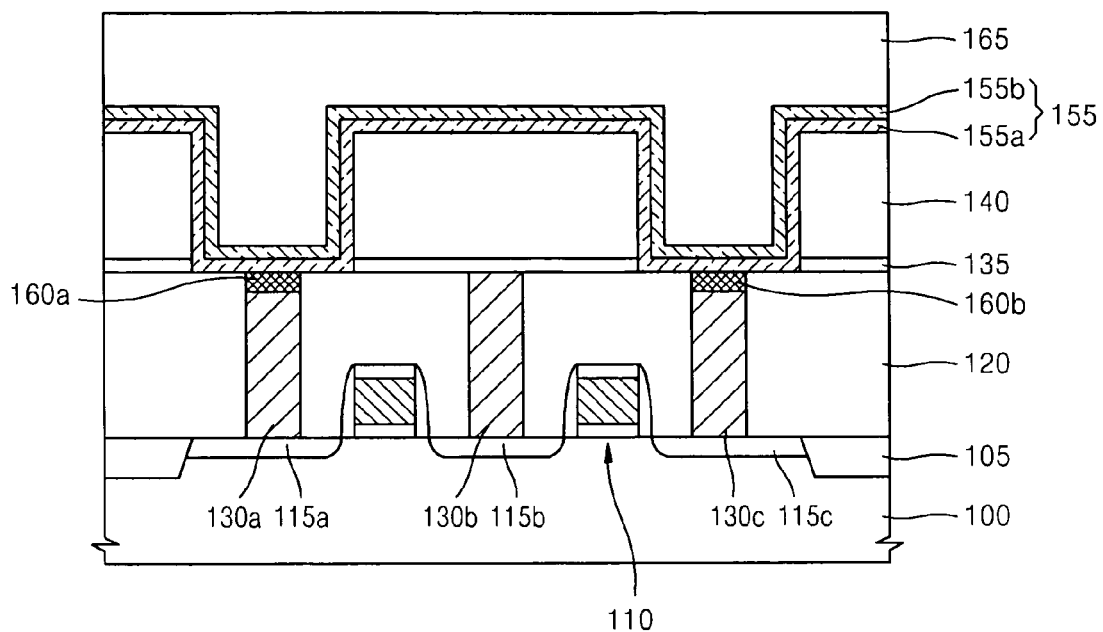

Referring to FIG. 7, a sacrificial layer 165 may be formed on the lower electrode layer 155 to cover the lower electrode layer 155. The sacrificial layer 165 may be formed of a material exhibiting an improved gap-fill characteristic and an improved etch selection ratio to that of silicon oxide or silicon nitride so as to be selectively removable. For example, the sacrificial layer 165 may be formed of photoresist based materials, e.g., antireflective coating (ARC), polysilicon, Ge, SiGe, or a combination thereof.

Figure 8:
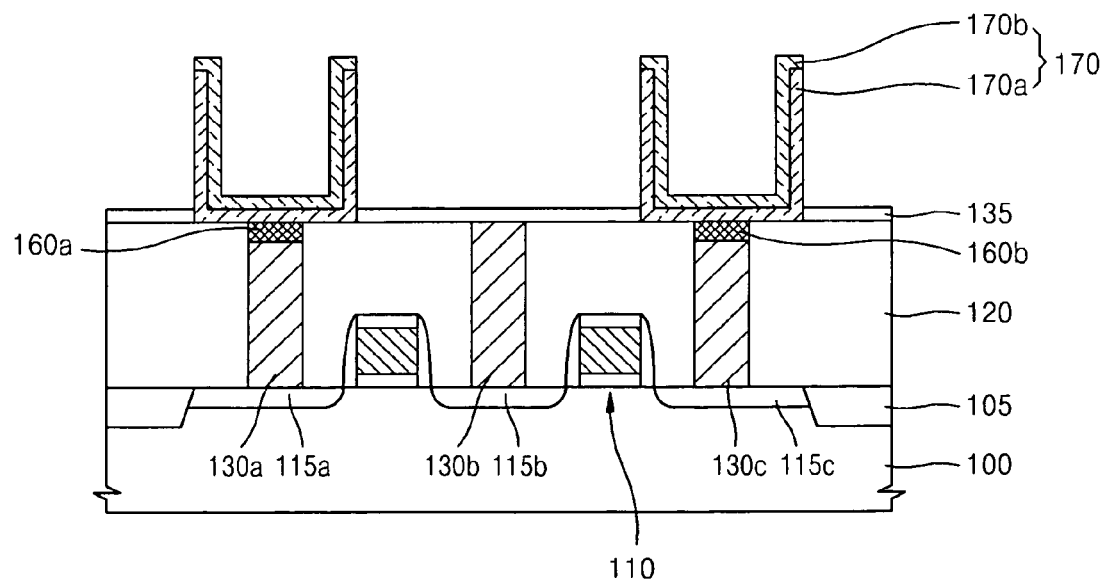

Referring to FIG. 8, separate lower electrodes 170 may be formed by patterning the sacrificial layer 165, the lower electrode layer 155, and the second interlayer insulation layer 140. The lower electrode 170 may have a structure in which a Ti layer 170a and a TiN layer 170b are patterned. For example, the sacrificial layer 165, the lower electrode layer 155, and the second interlayer insulation layer 140 may be patterned by using a lift off process.

The substrate 100 where the lower electrode 170 is formed may be heat treated. In detail, the substrate 100 where the lower electrode 170 is formed may be thermally nitridation treated. For example, the substrate 100 where the lower electrode 170 is formed may be thermally nitridation treated using $NH_3$ gas at a relatively high temperature. However, the thermal nitridation treatment is not limited to the use of $NH_3$ gas and may be performed in a gas atmosphere including a compound containing nitrogen. The thermal nitridation process may use at least one of a rapid thermal nitridation process (RTP), a spike RTP (s-RTP), and a flash RTP.

When a thermal nitridation treatment is performed on the substrate 100 where the lower electrode 170 is formed, both the Ti layer 170a and the TiN layer 170b may react with nitrogen, and thus, the Ti layer 170a becomes TiN and the crystallization of the TiN layer 170b may be further improved. Accordingly, the deposition structure of Ti and TiN of the lower electrode 170 may be changed to a single structure of TiN and crystallization of the lower electrode 170 may be improved. When the crystallization of the lower electrode 170 is improved, a leakage current may be reduced.

Figure 9:
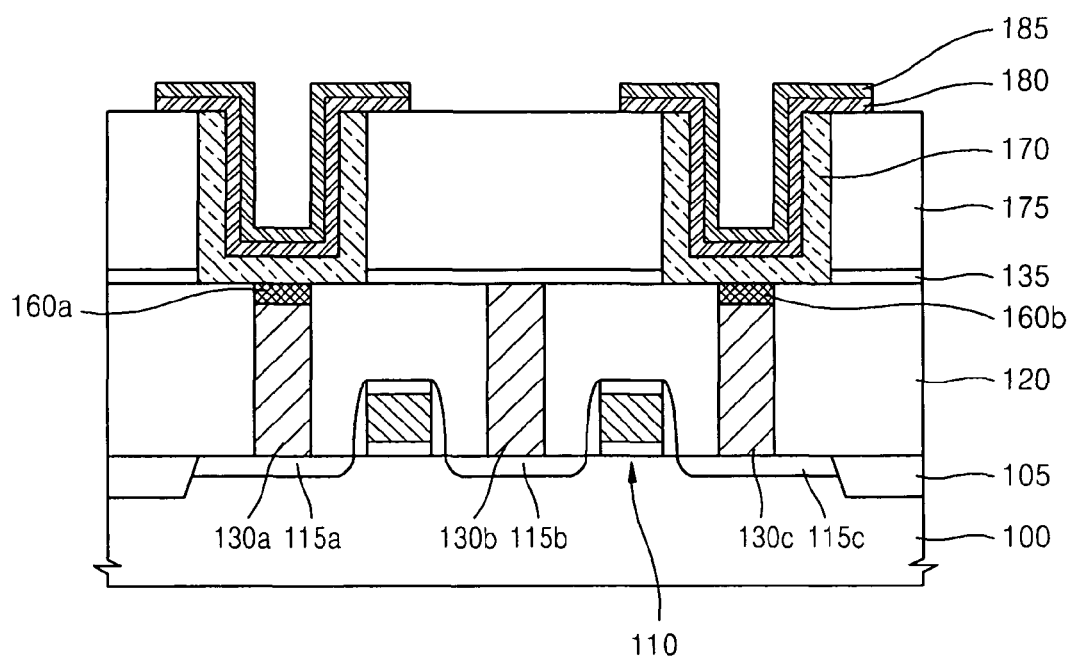

Referring to FIG. 9, a third interlayer insulation layer 175 may be formed on the etch stop layer 135. In detail, the third interlayer insulation layer 175 may be deposited on the etch stop layer 135 and the lower electrode 170. The third interlayer insulation layer 175 deposited on the lower electrode 170 may be removed by using an etch back process so that the third interlayer insulation layer 175 may be deposited only on the etch stop layer 135. The third interlayer insulation layer 175 may be formed by using at least one of PECVD, LPCVD, ALD, and SOG. Also, the third interlayer insulation layer 175 may be at least one of a silicon oxide layer, HSQ, BPSG, a HDP oxide layer, PETEOS, USG, PSG, PE-$SiH_4$, and $Al_2O_3$, but not limited thereto.

A dielectric layer 180 and an upper electrode 185 may be sequentially formed on and above the lower electrode 170. As a result, the lower electrode 170, the dielectric layer 180, and the upper electrode 185 constitute a capacitor. The dielectric layer 180 and the upper electrode 185 may be formed by using at least one of CVD, ALD, PECVD, PAALD, and cyclic CVD. The dielectric layer 180 may be formed of a high dielectric material, e.g., a tantalum oxide layer ($Ta_2O_5$), a hafnium oxide layer ($HfO_2$), and an aluminium oxide layer ($Al_2O_3$). The upper electrode 185 may be formed of at least one of titanium (Ti), cobalt (Co), molybdenum (Mo), tantalum (Ta), zirconium (Zr), tungsten (W), and nickel (Ni).

Figure 10:
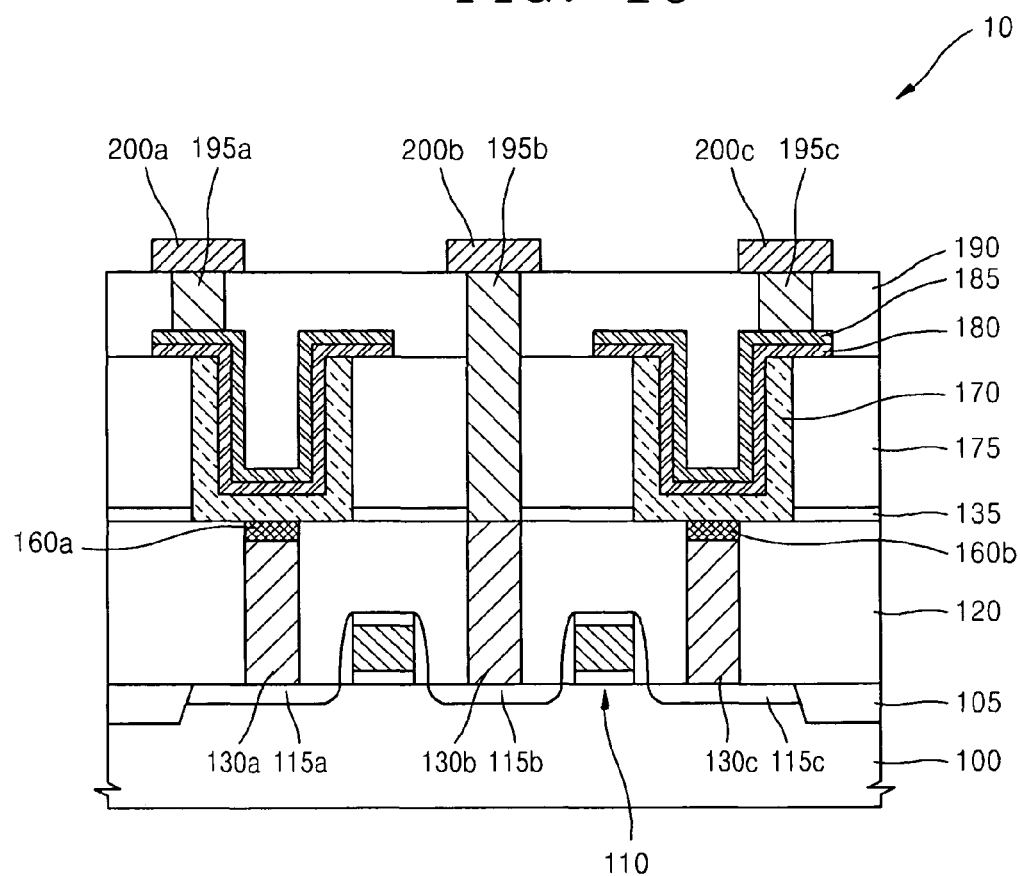

Referring to FIG. 10, a fourth interlayer insulation layer 190 may be formed on the third interlayer insulation layer 175, the dielectric layer 180, and the upper electrode 185. The fourth interlayer insulation layer 190 may be formed by using at least one of PECVD, LPCVD, ALD, and SOG. Also, the fourth interlayer insulation layer 190 is formed of at least one of a silicon oxide layer, HSQ, BPSG, a HDP oxide layer, PETEOS, USG, PSG, PE-$SiH_4$, and $Al_2O_3$, but not limited thereto.

An upper electrode contact hole (not shown) exposing a part of the upper electrode 185 may be formed by patterning the fourth interlayer insulation layer 190. The upper electrode contact hole may be filled with a conductive material. Thus, upper electrode contact plugs 195a and 195c may be formed. Also, a bit line contact hole (not shown) exposing the second buried contact plug 130b may be formed by patterning the fourth interlayer insulation layer 190. The bit line contact hole may be filled with a conductive material. Thus, a bit line contact plug 195b may be formed. A conductive pattern 200a and 200c connected to the upper electrode contact plugs 195a and 195c, and a bit line 200b connected to the bit line contact plug 195b may be formed.

Although the thickness of the lower electrode 170 decreases as the diameter of each of the second contact holes 145a and 145b for forming a capacitor decreases, a silicide reaction actively takes place between the amorphous areas 150a and 150b and the lower electrode 170 because a semiconductor device 10 manufactured by the above-described manufacturing process includes the amorphous areas 150a and 150b, that is, amorphous silicon, in the upper portions of the first and third buried contact plugs 130a and 130c. Accordingly, the metal silicide layers 160a and 160b formed by the silicide reaction have uniform crystallization so that resistance between the metal silicide layers 160a and 160b and the lower electrode 170 may be decreased.

Also, because the thermal nitridation process is performed even when the lower electrode 170 of the semiconductor device 10 has a deposition structure of Ti and TiN, the crystallization of the lower electrode 170 may be improved and leakage current may be reduced.

While the inventive concept has been particularly shown and described with reference to example embodiments thereof, it will be understood that various changes in form and details may be made therein without departing from the spirit and scope of the following claims.

What is claimed is:

1. A method of manufacturing a semiconductor device, the method comprising:
   forming a first interlayer insulation layer on a substrate including at least one gate structure formed thereon, the substrate having a plurality of source/drain regions formed on both sides of the at least one gate structure;
   forming at least one buried contact plug on at least one of the plurality of source/drain regions and in the first interlayer insulation layer;
   forming a second interlayer insulation layer on the first interlayer insulation layer and the at least one buried contact plug;
   exposing the at least one buried contact plug in the second interlayer insulation layer by forming at least one contact hole;
   implanting ions in the at least one contact hole in order to create an amorphous upper portion of the at least one buried contact plug;
   depositing a lower electrode layer on the second interlayer insulation layer and the at least one contact hole;
   forming a metal silicide layer in the amorphous upper portion of the at least one buried contact plug by a silicide reaction between the amorphous upper portion and the lower electrode layer, the amorphous upper portion of the at least one buried contact plug being an amorphous silicon area;
   depositing a sacrificial layer on the ower electrode layer;
   forming at least one lower electrode from the lower electrode layer by patterning the second interlayer insulation layer and the sacrificial layer; and
   performing a heat treatment on the substrate where the at least one lower electrode is formed at a temserature within a ran e of about 500° C. to about 900° C.,
   wherein performing the heat treatment further includes,
   performing a thermal nitridation process on the substrate where the at least one lower electrode is formed to improve crystallization of the at least one lower electrode, the thermal nitridation process including the use of an $NH_3$ gas by at least one of a rapid thermal nitridation process (RTP), a spike RTP (s-RTP), and a flash RTP.

2. The method of claim 1, wherein the lower electrode layer has a deposition structure of metal and metal nitride, and the at least one lower electrode has a metal nitride structure by the thermal nitridation process.

3. The method of claim 2, wherein the metal of the lower electrode layer is formed to have a thickness within a range of about 10 Å to about 300 Å and the thickness of the metal nitride is within a range of about 20 Å to about 500 Å.

4. The method of claim 1, wherein the thickness of the amorphous silicon area is within a range of about 30 Å to about 1,000 Å.

5. The method of claim 2, wherein the lower electrode layer is formed by using at least one of CVD, ALD, PECVD, plasma assisted ALD (PAALD), and cyclic CVD, and wherein the metal layer of the lower electrode layer is a Ti layer having a thickness within a range of about 10 Å to about 300 Å and the metal nitride layer of the lower electrode layer is a TiN layer having a thickness within a range of about 20 Å to about 500 Å.

6. The method of claim 1, further comprising:
   forming an etch stop layer on the first interlayer insulation layer and the at least one buried contact plug; and
   forming the second interlayer insulation layer on the etch stop layer.

7. The method of claim 6, wherein the second interlayer insulation layer is formed by using at least one of PECVD, LPCVD, ALD, and SOG and the thickness of the second interlayer insulation layer is about 8 µm or more.

8. The method of claim 1, wherein the ions are formed of at least one of Group V elements and inert elements.

9. The method of claim 8, wherein the Group V elements include As, P, and $N_2$, and the inert elements include Ar and F.

10. The method of claim 1, wherein implanting ions in the at least one contact hole further comprises:
    performing an ion implantation process with a dosage of about $1E^{13}$ ions/cm$^2$ to $5E^{16}$ ions/cm$^2$ and an energy of about 1 keV to about 50 keV.

11. The method of claim 1, wherein forming the at least one gate structure includes:
    sequentially depositing a gate insulating layer, a gate electrode layer and a capping layer on an active region of the substrate;
    patterning the gate insulating layer, the gate electrode layer and the capping layer; and
    forming spacers on sidewalls of the gate insulating layer, the gate electrode layer and the capping layer.

12. The method of claim 11, further comprising:
    forming the plurality of source/drain regions on both sides of the at least one gate structure in the active region of the substrate by performing a highly concentrated ion implantation process in the active region using the spacer as a mask.

13. The method of claim 1, wherein the first interlayer insulation layer is formed by using at least one of chemical vapor deposition (CVD), plasma-enhanced CVD (PECVD), low-pressure CVD (LPCVD), atomic layer deposition (ALD), and spin on glass (SOG).

14. The method of claim 1, wherein the at least one contact hole is formed to have a diameter within a range of about 80 nm to about 90 nm.

15. The method of claim 1, wherein the thickness of the amorphous upper portion of the at least one buried contact plug is within a range of about 30 Å to 1,000 Å.

* * * * *